United States Patent [19]

Ichimura

[11] Patent Number: 4,538,864
[45] Date of Patent: Sep. 3, 1985

[54] CONTACT ELEMENT WITH LOCKING MEANS

[75] Inventor: Yoshiaki Ichimura, Tokyo, Japan

[73] Assignee: Japan Aviation Electronics Industry, Tokyo, Japan

[21] Appl. No.: 570,749

[22] Filed: Jan. 16, 1984

[30] Foreign Application Priority Data

Jan. 18, 1983 [JP] Japan ................................ 58-6421

[51] Int. Cl.³ .......................................... H01R 23/72
[52] U.S. Cl. ................................................ 339/17 CF
[58] Field of Search ............ 339/17 R, 17 C, 17 LM, 339/17 M, 17 CF, 174, 176 M, 176 MP, 75 M, 75 MP; 174/52 FP; 361/392, 400, 403–406, 408

[56] References Cited

U.S. PATENT DOCUMENTS 3,479,634 11/1969 Pritulsky ...................... 339/176 MP

FOREIGN PATENT DOCUMENTS 1092673 12/1980 Canada ......................... 339/17 CF Primary Examiner—Neil Abrams
Attorney, Agent, or Firm—Laff, Whitesel, Conte & Saret

[57] ABSTRACT

A contact element for electrically connecting a leadless circuit package to another circuit plate having a self-locking function of the circuit package. The contact element has a base portion to be fixedly connected to the circuit plate, a contact portion to be in press-contact with a pad of the circuit package, and an intermediate portion extending between the base portion and the contact portion. The intermediate portion extends upwardly from the base portion, is bent to extend downwardly, and is turned to extend in an inclined upward direction. The contact portion is formed at the extended end of the inclined portion. A protrusion is formed at the bent portion to project to the side of the contact portion. When the circuit package is pressedly adapted to a connector using the contact elements to engage the terminal pads with the contact portions, the upper edge of the circuit package engages with the protrusions, so that the circuit package can be prevented from falling off upwardly from the contact elements.

15 Claims, 10 Drawing Figures

CONTACT ELEMENT WITH LOCKING MEANS

BACKGROUND OF THE INVENTION

This invention relates to connecting means for mounting and electrically connecting leadless circuit boards such as leadless integrated circuit packages, leadless large scaled integrated circuit packages, and leadless printed circuit boards to other circuit boards, and in particular, to contact elements used for such electical connection.

In order to electrically connect the leadless circuit boards (which will be referred to as "daugher board") employing terminal pads in place of leads onto another circuit board (which will be referred to as "mother board") such as a printed circuit board and a wiring board, an electrical connector has been used in the prior art as disclosed in U.S. Pat. Nos. 3,904,262, 4,063,791, 4,204,722 and others. Generally speaking, such a connector includes a housing of insulator material for receiving the daughter board therein, a plurality of contact element fixedly mounted in the housing to engage with terminal pads of the daughter board and to connect with conductor elements of the mother board on which the connector is mounted.

In conventional connectors of such a type, it has been desired to clamp the daughter board and the connector housing, to thereby maintain press contact of the terminal pads of the daughter board with the contact elements. A known clamping means has a cover plate to be engaged with the upper surface of the daughter board received in the housing and screw members for fastening the cover plate to the housing, for example, at four corners of the housing. In such a clamping means, the cover plate receives an upward force through the daughter board due to a reaction force of the contact elements, and therefore, the upward force acts on the housing through the screw members. Therefore, the cover plate and the housing are deflected, especially at intermediate portion between two screw members is greatest. As a result, the intended contact force cannot be obtained between certain pads and the corresponding contact elements.

Furthermore, in use for a long time and/or under a high temperature, the cover plate and the housing are permanently deformed because of deterioration of their insulator materials such as plastic resin, so that reliable contact between the pads and the contacts cannot be insured.

SUMMARY OF THE INVENTION

Accordingly, it is a principal object of this invention to provide a contact element capable of holding a leadless circuit board without using any other locking parts.

It is another object of this invention to provide an electrical connector capable of holding a leadless circuit board therein without use of any other parts than contact elements.

It is still another object of this invention to provide a contact element which is usable for mounting and electrically connecting a leadless circuit board onto another circuit board without use of any other parts.

It is yet another object of this invention to provide a contact element which is simple in construction, shape, and producing process.

According to this invention, a contact element of elastic metal material is obtained for electrically connecting a first electric circuit board having a terminal pad on one surface thereof to a second electric circuit board. The contact element comprises a first portion to be supported onto the second electric circuit board, a second portion extending from one end of the first portion, a third portion being bent at the extended end of the second portion and extending therefrom along the second portion with a space therebetween, and a fourth portion being turned at the extended end of the third portion to extend to go away from the second portion. The third portion has a protrusion portion projecting to be apart from the second portion. The fourth portion has a contact portion to be elastically pressed onto the pad of the first circuit board. The contact portion and said protrusion portion are positioned to be in directions separated by an acute angle as seen from the turning point between the third and fourth portions. Thus, the first circuit board can be maintained in a condition where the terminal pad is in contact with the contact portion when the first circuit board is pushed down to engage its upper peripheral edge with the protrusion portion.

According to this invention, there is further provided an electrical connector for mounting a first electric circuit board having terminal pads onto a second electric circuit board having conductor elements and electrically connecting the terminal pads with the conductor elements. The terminal pads are arranged along a peripheral edge of the first electric circuit board. The connector includes an insulator housing having a top opening recess for receiving the first electric circuit board and a bottom surface to be opposite to the second electric circuit board, a plurality of contact elements of elastic metal material being mounted in, and arranged along a peripheral edge of, said insulator housing. Each contact element has a first portion exposed on the bottom surface of the insulator housing to electrically connect with one of the conductor element of the second electric circuit board, a second portion extending from one end of the first portion and being supported within said insulator at its lower portion, a third portion being bent at the extended end of the second portion inwardly and extending therefrom along the second portion with a space therebetween, and a fourth portion being turned at the extended end of the third portion to extend to go away from the second portion. The third portion has a protrusion portion projecting to be apart from the second portion, and the fourth portion has a contact portion to be elastically pressed onto one of the pads of said first circuit board. The contact portion and the protrusion portion are positioned to be in directions separated by an acute angle as seen from the turning point between the third and fourth portions.

Further objects, features and other aspects of this invention will be understood from the following detailed description of preferred embodiments referring to the accompanying drawings.

DETAILED DESCRIPTION OF PREFERRED EMBODIMENTS

Figure 1:
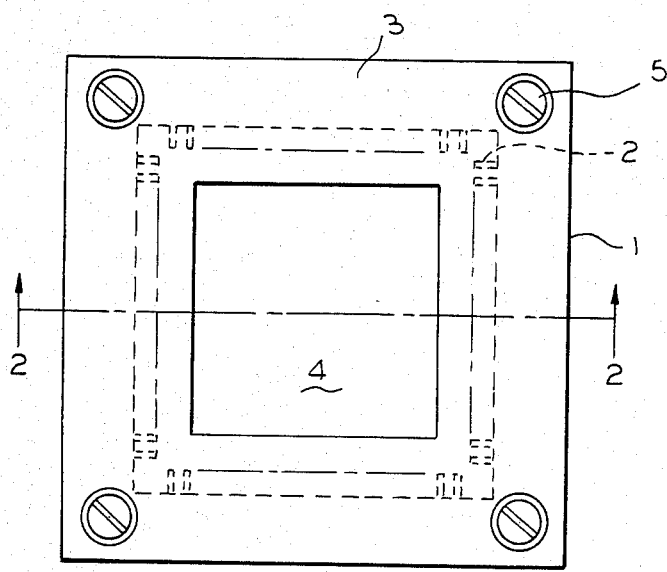
FIG. 1 is a plan view of an electrical connector for a leadless circuit board known in the prior art.
Figure 2:
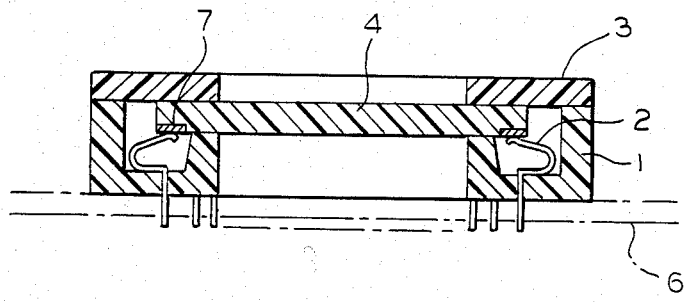
FIG. 2 is a sectional view along a line II—II in FIG. 1.

Referring to FIGS. 1 and 2, a known connector includes a connector housing 1 of a plastic resin and the like, a plurality of contact elements 2 mounted in connector housing 1, a cover plate 3 of a plastic resin and the like engaging with a leadless integrated circuit package or a daughter board 4 into connector housing 1, and four screw members 5 fastening cover plate 3 to housing 1, as disclosed in, for example, U.S. Pat. Nos. 3,904,262, 4,063,791, 4,204,722, 4,340,266 and others.

The connector is mounted on another circuit board or a mother board 6, and contact elements 2 are connected to conductors on mother board 6. Daughter board 4 is depressed and held in connector housing 1 by cover plate 3 fastened to housing 1 by screw members 5, and terminal pads 7 of daughter board 4 are pressed onto, an in contact with, contact portions of contact elements 2. Thus, daughter board 4 is electrically connected with the mother board 6.

This arrangement has a problem that reliable contact between contact elements 2 and terminal pads 7 is not always insured, as described hereinbefore.

Figure 3:
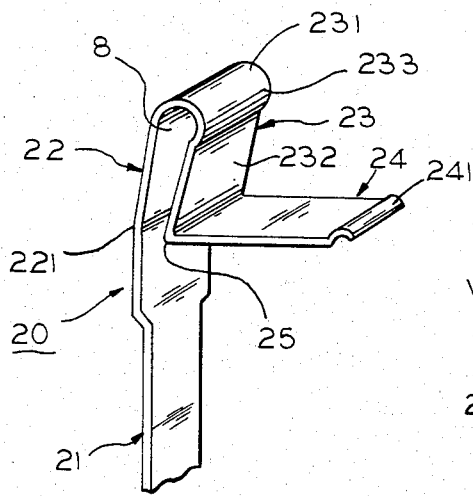
FIG. 3 is a perspective view of a contact element of an embodiment of this invention.
Figure 4:
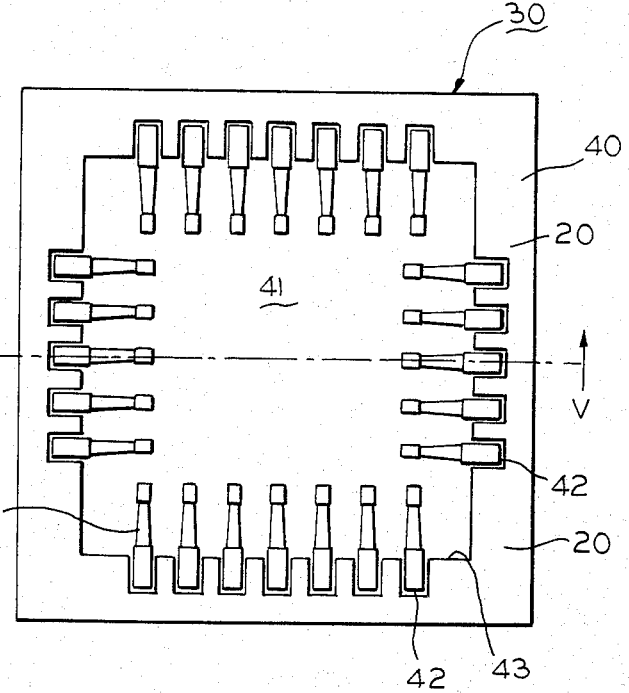
FIG. 4 is a plan view of an electrical connector having the contact elements as shown in FIG. 3.

Referring to FIG. 3, a contact element 20 shown therein is made of an elastic metal plate. Contact element 20 comprises a first portion 21, a second portion 22, a third portion 23 and a fourth portion 24. First and second portions 21 and 22 continuously extend along a generally straight imaginary line. Second portion 22 is slightly bent at an intermediate portion 221 thereof. Third portion 23 has a semi-cylindrically curved portion 231 which curvilinearly extends over an angular extent larger than 180° from the extended end of second portion 22, and a straight portion 232 substantially straightly extending from curved portion 231 along second portion 22 with a space 8. A protrusion portion 233 is formed by a part of curved portion 231 adjacent straight portion 232 and projects to be apart from second portion 22. Fourth portion 24 is continuously connected to the extended end of straight portion 232 of third portion 23 at a turning point 25 and extends to go away from second portion 22. A contact portion 241 is formed at the extended end of four portion 24. Protrusion portion 233 and contact portion 241 are positioned to be in directions separated by an acute angle as seen from the turning point 25 between third portion 23 and fourth portion 24. The turning point 25 is opposite to the slightly bent position 221 of second portion 22 with a space.

Referring to FIGS. 4–7, a connector 30 shown therein includes a rectangular connector housing 40 which is made of insulator material such as polycarbonate, polypropylene and the like. Housing 40 has a rectangular recess 41 formed in the center portion of its top surface for receiving daughter board 4, and a plurality of vertical grooves 42 arranged in each peripheral vertical wall 43 defining recess 41 to correspond to the terminal pads 7 of the daughter board 4.

A plurality of contact elements 20 are disposed in vertical grooves 42 and are supported with housing 40 at respective second portions 22. In this arrangement, each protrusion 233 projects from peripheral wall 43 into recess 41, and each fourth portion 24 extends into recess 41. First portion 21 perpendicularly protrudes from a bottom surface 44 of housing 40.

Figure 5:
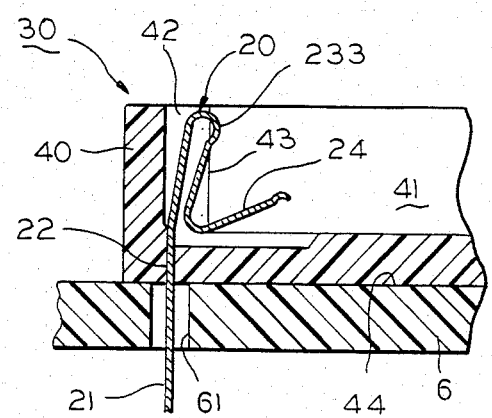
FIG. 5 is a sectional view of a main portion along a line V—V in FIG. 4.

Connector 30 is mounted on mother board 6 so that first portions 21 of contact elements 20 are respectively inserted through apertures 61 of mother board 6, as shown in FIG. 5, and then each first portion 21 is connected to a corresponding conductor (not shown) of mother board 6 by solder means and the like.

Figure 6:
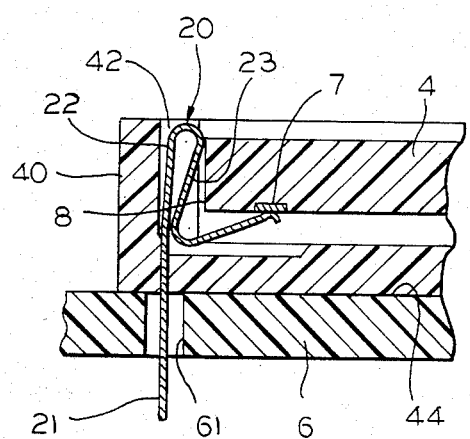
FIG. 6 is a sectional view similar to FIG. 5 with a leadless circuit board being inserted into the connector.
Figure 7:
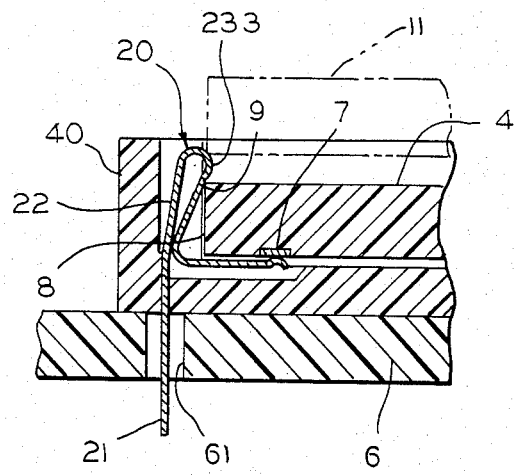
FIG. 7 is a sectional view similar to FIG. 6 with the leadless circuit board being completely received into the connector.

In the arrangement of connector 30, when daughter board 4 is pressedly inserted into rectangular recess 41 of housing 40, protrusions 233 are outwardly pushed out by engaging to peripheral surface 8 of daughter board 4, so that second and third portions 22 and 23 of contact elements 20 are urged outwardly, as shown in FIG. 6. After inserting daughter board 4 until peripheral surface 8 passes protrusions 233, protrusions 233 inwardly move by the electric reaction force of second portions 22, to thereby engage with an upper peripheral edge 9 of daughter board 4, as shown in FIG. 7. Therefore, daughter board 4 is prevented by protrusions 233 to automatically fall off from connector 30.

Furthermore, when inserting daughter board 4, contact portions 24 of contact elements 20 are in contact with and depressed downwardly by pads 7 of daughter board 4, whereby the angle made by straight portions 232 and 24 is enlarged. Referring to FIG. 7 wherein daughter board 4 has been completely inserted into connector 30, a daughter board 4 is pressed upwardly by contact pressure with contact portions 241, whereby daughter board 4 is pinched by protrusions 233 and contact portions 241 of contact elements 20 to be maintained stationary.

Inserted daughter board 4 can be easily removed by applying a plate 11 onto daughter board 4, an outer shape of which is similar to that of daughter board 4, as shown in FIG. 7. That is, plate 11 is pressed onto daughter board 4, and when the force depressing plate 11 is freed, daughter board 4 is pushed out from connector 30 by the reaction force of contact elements 20.

Figure 8:
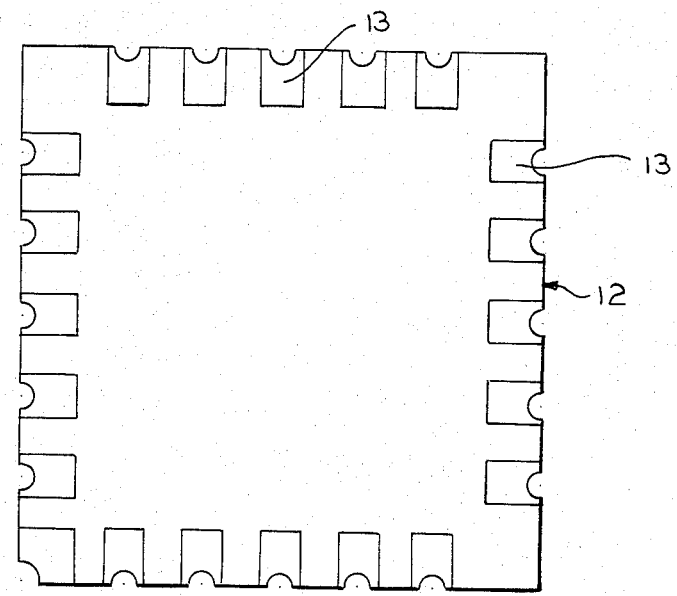
FIG. 8 is a plan view of another leadless integrated circuit package.

There is known another daughter board 12 of a type as shown in FIG. 8, which has a plurality of pads 13 arranged along, and in the vicinity of, its peripheral edge. In order to connect such a daughter board 12, another embodiment of this invention has a cover member 60 as shown in FIG. 9.

Figure 9:
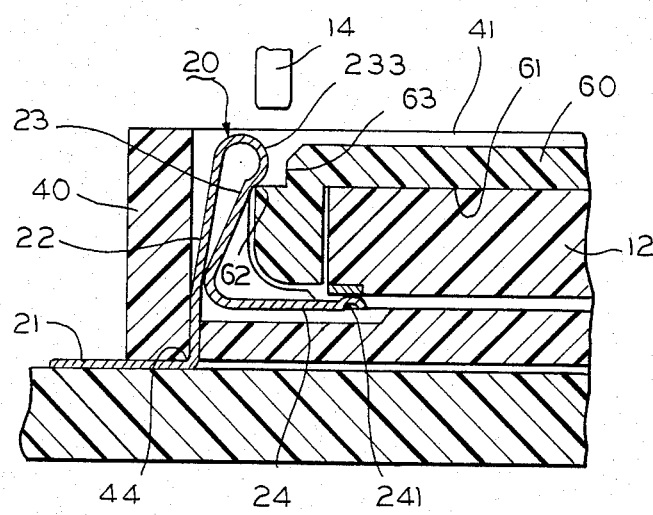
FIG. 9 is a sectional view of an electrical connector of another embodiment which is adaptable for the leadless integrated circuit package of FIG. 8.

Referring to FIG. 9, the connector is made similar to the embodiment of FIGS. 4–7 except for provision of the cover member 60. Cover plate 60 has an outer shape corresponding to recess 41 of connector housing 40 and can be inserted into the recess 41. The cover plate 60 is formed with a central depression 61 in its bottom surface for receiving the daughter board 12.

In mount of daughter board 12 into the connector, the daughter board 12 is inserted into depression 61 of cover plate 60. Then, the cover plate 60 including daughter board 12 is pressedly inserted into recess 41 of connector housing. At that time, the second and third portions 22 and 23 of contact elements 20 are pushed outwardly, while fourth portions 24 of the contact elements are depressed, in a similar manner as described above in connection with FIGS. 6 and 7. After the upper edge 62 of cover plate 60 passed protrusion 233 of contact elements 20, the second and third portions 22 and 23 move inwardly due to elasticity of the contact elements. So that the lower portion of each protrusion 233 engages with the upper edge of cover member 60 to prevent the cover member 60 from upwardly falling off from the connector. Accordingly, daughter board 12 is maintained to be pressed onto fourth position 24 of each contact element 20. Thus, the terminal pads 13 of daughter board 12 are in press-contact with contact portions 241 of contact elements 20.

It is also easily possible to remove the inserted daughter board 12 by moving protrusions 23 outwardly by the use of a tool. For example, a step 63 is formed in the vicinity of the edge on the upper surface of cover member 60 as shown in FIG. 9, a plate 14 is inserted into a gap between protrusions 233 and the step to move protrusions 233 outwardly, so that cover member 60 can be taken out upwardly together with daughter board 12.

In the embodiment as shown in FIG. 9, first portion 21 of each contact element 20 is perpendicularly bent to second portion 22 and extends along the bottom surface 44 of connector housing 40. First portion 21 is connected to a conductive pattern (not shown) formed on mother board 6 by solder means and the like.

As described above, the daughter board can be maintained by contact elements themselves in a condition that the terminal pads of the daughter board are in press-contact with contact portions of the contact elements. Therefore, the connector housing can be omitted if it is not necessary.

Figure 10:
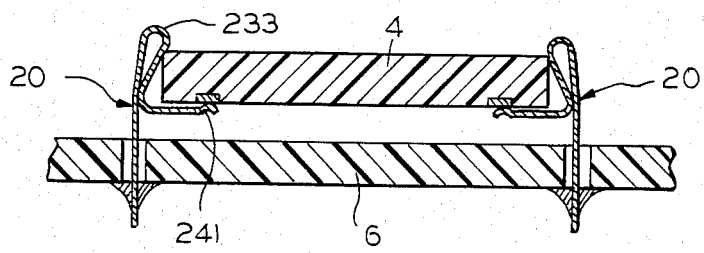
FIG. 10 is a sectional view of another embodiment.

Referring to FIG. 10, a plurality of contact elements 20 are fixedly mounted on mother board 6. Then, daughter board 4, or cover plate 60 having daughter board 12 is pressedly inserted into a space defined by the contact elements 20. So that daughter board 4 is stationarily supported by contact elements on the mother board 6 while establishing electrical connection between daughter and mother boards.

What is claimed is:

1. A contact element formed of an elastic metal material for electrically connecting a first planar electric circuit board having a terminal pad on a bottom surface and adjacent a peripheral edge thereof to a second electric circuit board, said contact element comprising:
   a first portion to be supported on said second electric circuit board;
   a second portion extending from one end of said first portion;
   a third portion being bent at the extended end of said second portion and extending therefrom along said second portion with a space therebetween, said third portion having a small protrusion portion projecting away from said second portion to make a downwardly directed step portion on the surface thereof; and
   a fourth portion being turned at the extended end of said third portion to extend away from said second portion, said fourth portion having an upwardly directed contact portion to be elastically pressed onto the pad of said first circuit board, said contact portion and said step portion being positioned to be in directions separated by an acute angle as seen from said turning point between said third and fourth portions, whereby said first circuit board may be maintained in a position where the terminal pad is in contact with said contact portion when said first circuit board is pushed down to engage the upper peripheral edge thereof with said setp portion, with said step portion supporting an external force applied to said first circuit board in a direction of said contact element by engagement with the peripheral edge of the circuit board to block motion thereof in its own plane, as well as downwardly retaining said first circuit board.

2. The contact element as claimed in claim 1, wherein said third portion comprises a curved portion extending curvilinearly over an angle slightly larger than 180° from the extended end of said second portion and a straight portion substantially straightly extending from the extended end of said curved portion to said fourth portion to be substantially parallel to said second portion, said protrusion portion being constituted by a part of said curved portion so that said step portion is formed at a connecting portion between said straight portion and said curved portion.

3. The contact element as claimed in claim 2, wherein said fourth portion is substantially straightly extending to make an acute angle to said straight portion of said third portion.

4. The contact element as claimed in claim 1, wherein said second portion is slightly bent towards said third portion at a position adjacent the turning point between said third and fourth portions.

5. The contact element as claimed in claim 1, wherein said first portion and said second portion substantially straightly extend.

6. The contact element as claimed in claim 1, wherein said first portion and said second portion are substantially perpendicular to one another.

7. The contact element as claimed in claim 6, wherein said first portion and said fourth portion extend respectively in substantially opposite directions.

8. In an electrical connector for mounting a first planar electric circuit board having terminal pads on a second electric circuit board having conductor elements and electrically connecting the terminal pads with the conductor elements, said terminal pads being arranged on a bottom surface and adjacent a peripheral edge of the first electric circuit board, said connector including an insulator housing having a top opening recess for receiving said first electric circuit board and a bottom surface which is to be opposite said second electric circuit board, a plurality of contact elements of elastic metal material mounted in, and arranged along a peripheral edge of said insulator housing, the improvement which comprises:
   each of said contact elements having a first portion which is exposed from the bottom surface of said insulator housing to make an electrical connection with one of the conductor elements of said second electric circuit board, a second portion extending from one end of said first portion and being supported within a lower portion of said insulator, a third portion at the extended end of said second portion, said third portion being inwardly and extending therefrom along said second portion with a space therebetween, and a fourth portion at the extended end of said third portion, said fourth portion extending away from said second portion, said third portion having a small protrusion portion projecting away from said second portion to make a downwardly directed step portion on the surface thereof, said fourth portion having an upwardly directed contact portion to be elastically pressed onto one of the pads of said first circuit board, said contact portion and said step portion being positioned to be in directions separated by an acute angle as seen from said turning point between said third and fourth portions, whereby said first circuit board may be maintained in a condition where each of the terminal pads is in contact with said contact portion of each one of said contact elements when said first circuit board is pushed down to engage the upper peripheral edge thereof with said step portion of each contact element restricting a lateral movement of said first circuit board by engagement with the peripheral edge of the circuit board to block motion thereof in its own plane as well as downwardly retaining said first circuit board.

9. The electrical connector as claimed in claim 8, wherein each of said third portions comprises a curved portion extending curvilinearly over an angle slightly larger than 180° from the extended end of said second portion and a straight portion substantially straightly extending from the extended end of said curved portion to said fourth portion to be substantially parallel to said second portion, each of said protrusion portions being constituted by a part of said curved portions.

10. The electrical connector as claimed in claim 9, wherein each of said fourth portions is substantially straightly extending to make an acute angle to said straight portion of said third portion.

11. The electrical connector as claimed in claim 8, wherein each of said second portions is slightly bent towards said third portion at a position adjacent the turning point between said third and fourth portions.

12. The electrical connector as claimed in claim 8, wherein said first portions substantially straightly project from the bottom of said insulator housing, respectively.

13. The electrical connector as claimed in claim 8, wherein said first portions extend along the bottom surface of said insulator housing.

14. The electrical connector as claimed in claim 8, which further comprises an additional insulator member to be overlaid on the first electric circuit board to be connected to said connector, said additional insulator member having an upper edge to engage said protrusion portions to prevent said additional insulator member from being dislodged upwardly and from moving laterally, whereby said first electric circuit board can be clamped between said additional insulator member and said contact portions.

15. The electrical connector as claimed in claim 14, wherein said additional insulator member is a cover member to cover said first electric circuit board.

* * * * *